(12) United States Patent
Chen

(10) Patent No.: US 9,319,003 B2
(45) Date of Patent: Apr. 19, 2016

(54) AUDIO AMPLIFIER

(71) Applicant: MEDIATEK INC., Hsin-Chu (TW)

(72) Inventor: Kuo-Hsin Chen, Hsinchu (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 490 days.

(21) Appl. No.: 13/655,400

(22) Filed: Oct. 18, 2012

(65) Prior Publication Data

US 2013/0121512 A1 May 16, 2013

Related U.S. Application Data

(60) Provisional application No. 61/559,240, filed on Nov. 14, 2011.

(51) Int. Cl.
*H03F 99/00* (2009.01)
*H03F 1/34* (2006.01)
*H03F 3/68* (2006.01)
*H03F 3/217* (2006.01)

(52) U.S. Cl.
CPC ............. *H03F 1/34* (2013.01); *H03F 3/2173* (2013.01); *H03F 3/68* (2013.01)

(58) Field of Classification Search
CPC ............. H03F 99/00; H03F 1/34; H03F 1/36; H04R 5/04
USPC ......... 381/120–121, 104, 106–107, 109, 123; 330/51
See application file for complete search history.

(56) References Cited

U.S. PATENT DOCUMENTS

| 5,103,675 A * | 4/1992 | Komninos ..................... 73/592 |
| 2007/0018719 A1* | 1/2007 | Seven ............................. 330/51 |
| 2008/0063219 A1* | 3/2008 | Park .............................. 381/107 |
| 2009/0051423 A1* | 2/2009 | Miaille et al. .................. 330/10 |
| 2009/0092267 A1* | 4/2009 | Wu et al. ....................... 381/120 |
| 2009/0154731 A1* | 6/2009 | Chen et al. .................... 381/120 |
| 2011/0150244 A1 | 6/2011 | Lin |
| 2013/0094668 A1* | 4/2013 | Poulsen et al. ............... 381/107 |

FOREIGN PATENT DOCUMENTS

CN         101729030 A      6/2010

OTHER PUBLICATIONS

Kuo-Hsin Chen, Yen Shun Hsu, A 106dB PSRR Direct Battery Connected Reconfigurable Class-AB/D Speaker Amplifier for Handsfree/Receiver 2-in-1 Loudspeaker, IEEE Asian Solid-State Circuits Conference, Nov. 14-16, 2011, 221-224, Jeju, Korea.

* cited by examiner

*Primary Examiner* — Disler Paul
(74) *Attorney, Agent, or Firm* — Winston Hsu; Scott Margo

(57) ABSTRACT

An amplifier includes: a first operational signal path arranged to generate a first pre-output signal according to an input signal under a first operating mode of the amplifier; a second operational signal path arranged to generate a second pre-output signal according to the input signal under a second operating mode of the amplifier; and an output stage, coupled to the first operational signal path and the second operational signal path, for outputting a first output signal according to the first pre-output signal under the first operating mode and outputting a second output signal according to the second pre-output signal under the second operating mode, wherein the first operational signal path and the second operational signal path are arranged to share at least one common circuit element for generating the first pre-output signal and the second pre-output signal under the first operating mode and the second operating mode, respectively.

12 Claims, 12 Drawing Sheets

AUDIO AMPLIFIER

CROSS REFERENCE TO RELATED APPLICATIONS

This application claims the benefit of U.S. Provisional Application No. 61/559,240, which was filed on Nov. 14, 2011 and is included herein by reference.

BACKGROUND

The present invention relates to an audio amplifier, and more particularly to a low cost multi-purposes audio amplifier.

In a portable communication device, the audio signal may be outputted via different amplifying devices when the portable communication device operates under different modes. The different amplifying devices are arranged to generate audio signal with different sounds respectively. Therefore, the audio subsystem of the portable communication device may comprise various sets of different amplifiers, in which each set of amplifier is arranged to amplify an audio signal with a specific range of power. For example, when a user uses an ear speaker to listen the audio generated by the portable communication device, the amplifier in the audio subsystem used for amplifying the pre-output audio signal may be a Class-AB amplifier. When the user uses a headphone to listen the audio generated by the portable communication device, the amplifier in the audio subsystem used for amplifying the pre-output audio signal may be another Class-AB amplifier. When the user uses a hands-free speaker to listen the audio generated by the portable communication device, the amplifier in the audio subsystem used for amplifying the pre-output audio signal may be a Class-D amplifier or a Class-AB amplifier. Conventionally, the above-mentioned amplifiers are three sets of separated amplifiers in the audio subsystem. Therefore, the above-mentioned amplifiers occupy a large area in the portable communication device. Nowadays, the large size of audio subsystem may greatly reduce the product competitiveness of the portable communication device. Thus, how to reduce the size or hardware requirement of an audio subsystem is an urgent problem in this field.

SUMMARY

Therefore, one of the objectives of the present invention is to provide a low cost multi-purposes audio amplifier.

According to an embodiment of the present invention, an amplifier is disclosed. The amplifier comprises a first operational signal path, a second operational signal path, and an output stage. The first operational signal path is arranged to generate a first pre-output signal according to an input signal under a first operating mode of the amplifier. The second operational signal path is arranged to generate a second pre-output signal according to the input signal under a second operating mode of the amplifier. The output stage is coupled to the first operational signal path and the second operational signal path, for outputting a first output signal according to the first pre-output signal under the first operating mode and outputting a second output signal according to the second pre-output signal under the second operating mode, wherein the first operational signal path and the second operational signal path are arranged to share at least one common circuit element for generating the first pre-output signal and the second pre-output signal under the first operating mode and the second operating mode, respectively.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
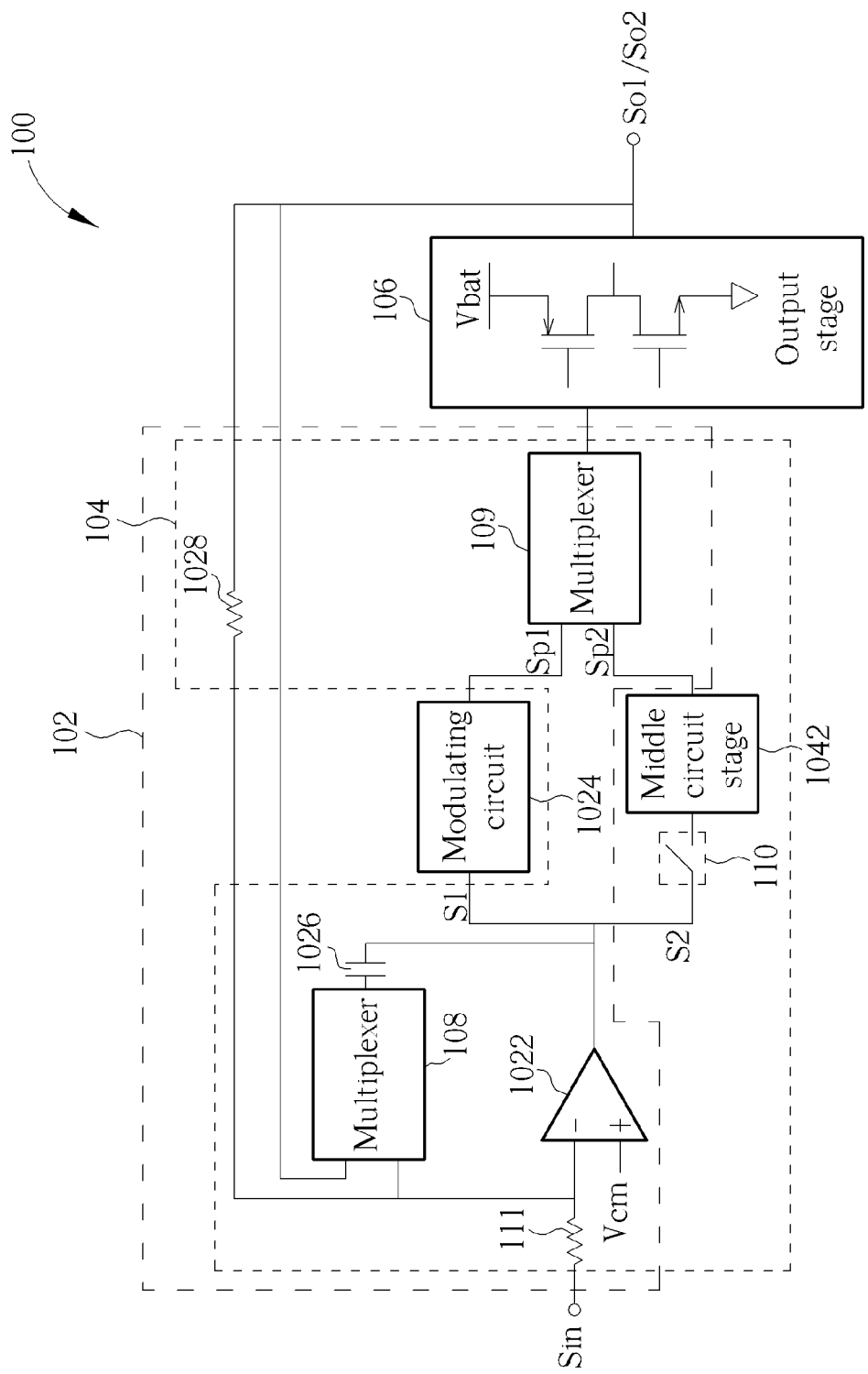
FIG. 1 is a diagram illustrating an amplifier according to a first embodiment of the present invention.

Please refer to FIG. 1, which is a diagram illustrating an amplifier 100 according to a first embodiment of the present invention. Specifically, the amplifier 100 may be a multi-purpose audio amplifier of a portable communication device, which may output different audio signals with different powers under different modes respectively. It is noted that the different powers of the audio signals may result different volumes respectively. For example, when a user uses a headphone or an ear speaker to listen the audio generated by the portable communication device, the power of the output audio signal may be small but the linearity of the output audio signal should be high. When the user uses a hands-free speaker to listen the audio generated by the portable communication device, the power of the output audio signal should be high but the linearity of the output audio signal may be small. Therefore, in this embodiment, the operation of the amplifier 100 may have two different operating modes, the first operating mode is a switch mode and the second operating mode is a linear mode. It is noted that the switch mode of the amplifier 100 is capable of generating an audio signal having large power and small linearity, and the linear mode of the amplifier 100 is capable of generating an audio signal having small power and high linearity. For example, the switch mode may be a class-D mode of the amplifier 100 and the linear mode may be a class-AB mode, a class-H mode or a class-G mode of the amplifier 100.

In this embodiment, the amplifier 100 comprises a first operational signal path 102, a second operational signal path 104, and an output stage 106. The first operational signal path 102 is arranged to generate a first pre-output signal Sp1 according to an input signal Sin under the switch mode of the amplifier 100. The second operational signal path 104 is arranged to generate a second pre-output signal Sp2 according to the input signal Sin under the linear mode of the amplifier 100. The output stage 106 is coupled to the first operational signal path 102 and the second operational signal path 104 for outputting a first output signal So1 according to the first pre-output signal Sp1 under the switch mode and outputting a second output signal So2 according to the second pre-output signal Sp2 under the linear mode. Furthermore, the first operational signal path 102 and the second operational signal path 104 are arranged to share at least one common circuit element for generating the first pre-output signal Sp1 and the second pre-output signal Sp2 under the switch mode and the linear mode, respectively.

Figure 2A:
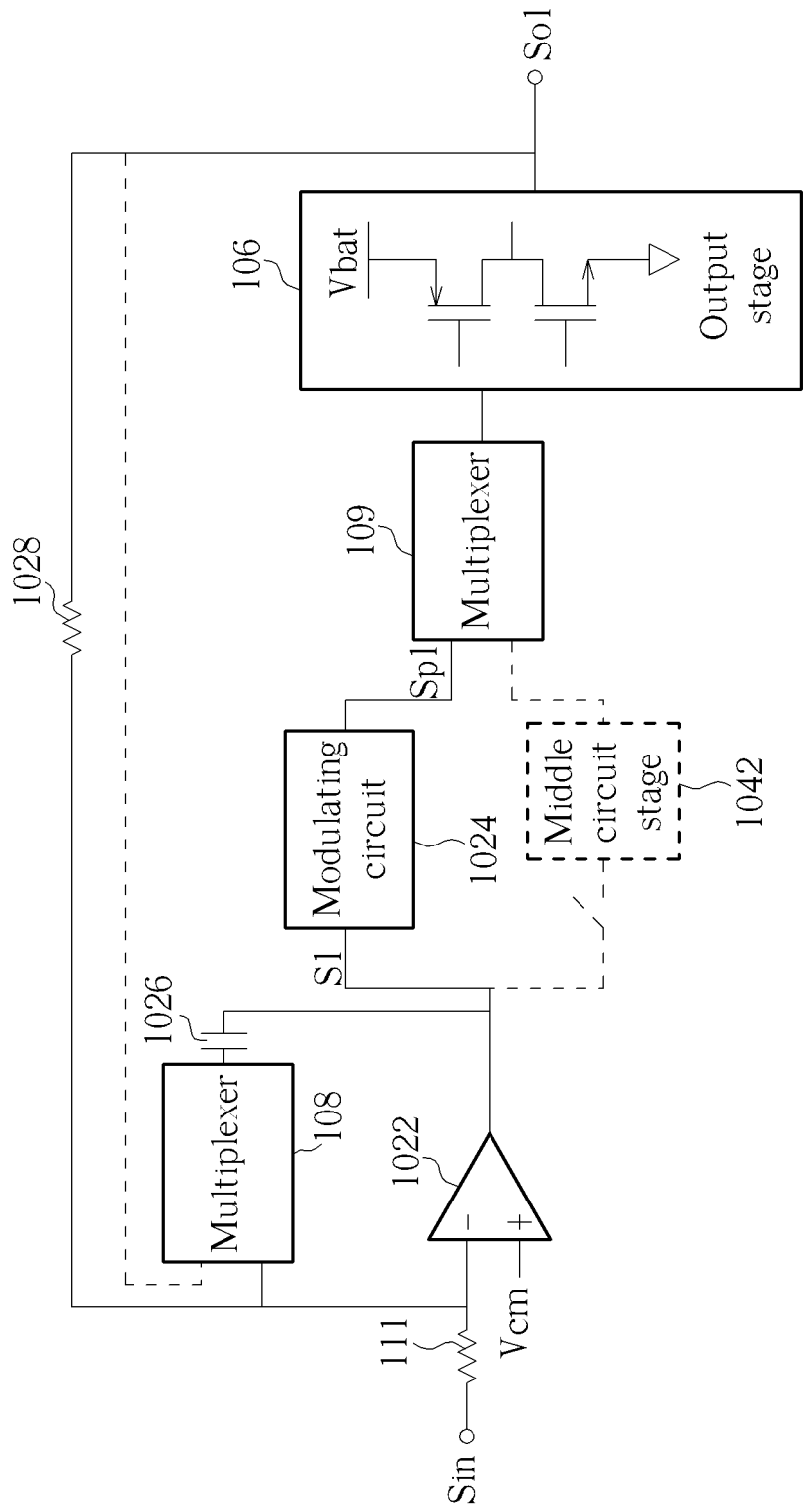
FIG. 2A is a diagram illustrating the amplifier in FIG. 1 operating under the switch mode according to an embodiment of the present invention.
Figure 2B:
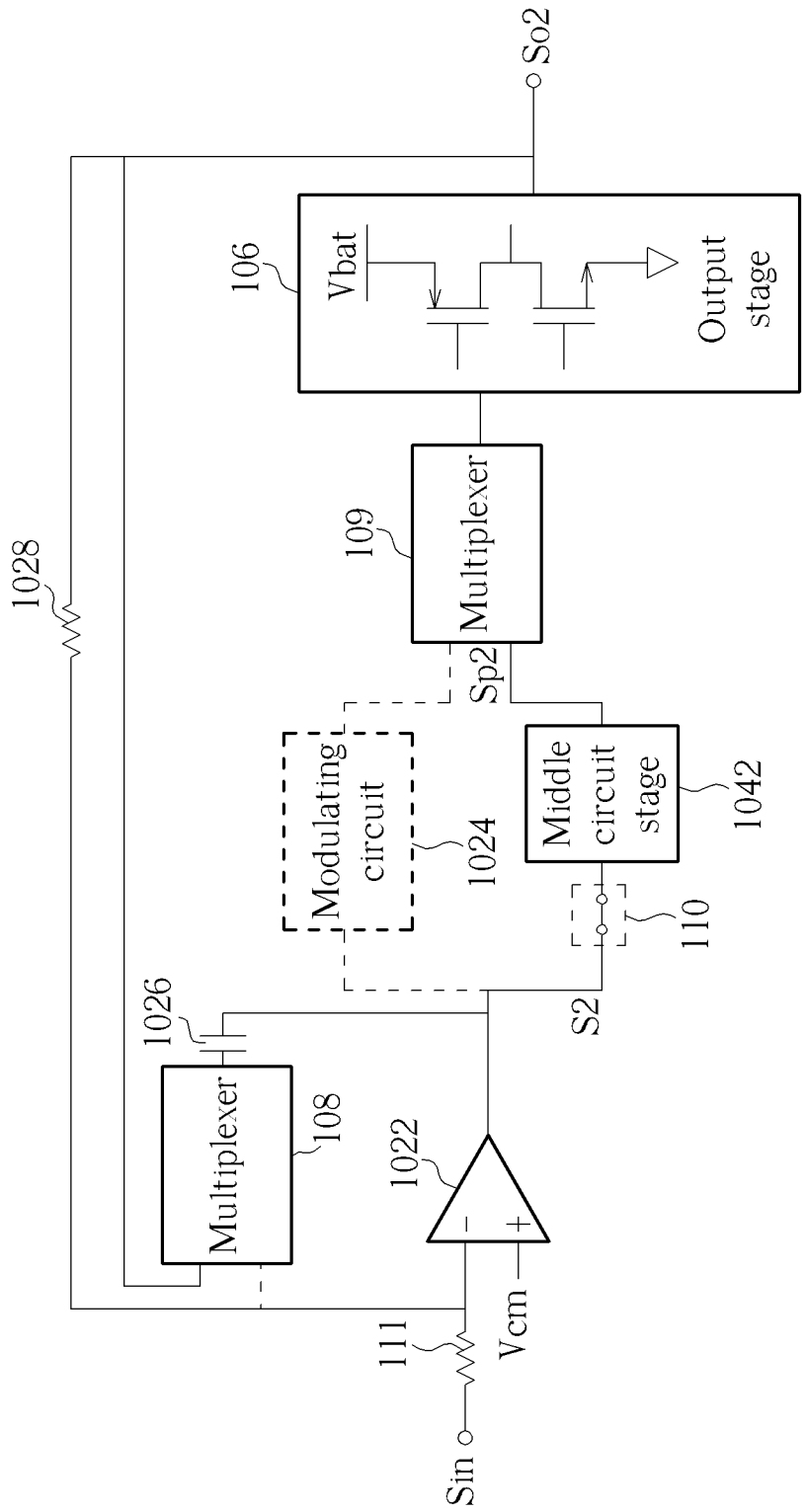
FIG. 2B is a diagram illustrating the amplifier in FIG. 1 operating under the linear mode according to an embodiment of the present invention.

Please refer to FIG. 2A and FIG. 2B. FIG. 2A is a diagram illustrating the amplifier 100 operating under the switch mode according to an embodiment of the present invention. FIG. 2B is a diagram illustrating the amplifier 100 operating under the linear mode according to an embodiment of the present invention. When the amplifier 100 operates under the switch mode, the first operational signal path 102 comprises a common circuit stage 1022, a modulating circuit 1024, a first common feedback circuit 1026, and a second common feedback circuit 1028. The common circuit stage 1022 is arranged to receive the input signal Sin for generating a first signal S1. The modulating circuit 1024 is arranged to perform a modulation upon the first signal S1 for generating the first pre-output signal Sp1. The first common feedback circuit 1026 is arranged to couple between an input terminal, i.e. the negative input terminal (−), of the common circuit stage 1022 and an output terminal of the common circuit stage 1022, wherein the input terminal of the common circuit stage 1022 is arranged to receive the input signal Sin, and the output terminal of the common circuit stage 1022 is arranged to output the first signal S1. The second common feedback circuit 1028 is arranged to couple between the input terminal of the common circuit stage 1022 and the output terminal of the output stage 106, wherein the output terminal of the output stage 106 is arranged to output the first output signal So1.

On the other hand, when the amplifier 100 operates under the linear mode, the second operational signal path 104 comprises the common circuit stage 1022, a middle circuit stage 1024, the first common feedback circuit 1026, and the second common feedback circuit 1028. The common circuit stage 1022 is arranged to receive the input signal Sin for generating a second signal S2. The middle circuit stage 1042 is arranged to receive the second signal S2 for generating the second pre-output signal Sp2. The first common feedback circuit 1026 is arranged to couple between the output terminal of the common circuit stage 1022 and the output terminal of the output stage 106, wherein the output terminal of the common circuit stage 1022 is arranged to output the second signal S2, and the output terminal of the output stage 106 is arranged to output the second output signal So2. The second common feedback circuit 1028 is arranged to couple between the input terminal of the common circuit stage 1022 and the output terminal of the output stage 106, wherein the input terminal of the common circuit stage 1022 is arranged to receive the input signal Sin.

According to FIG. 2A and FIG. 2B, the common circuit element when the amplifier 100 operates under the switch mode and the linear mode includes the common circuit stage 1022, the output stage 106, the first common feedback circuit 1026, and the second common feedback circuit 1028. When the amplifier 100 operates under the switch mode, the middle circuit stage 1042 of the second operational signal path 104 is disconnected (or just disable) from the output terminal of the common circuit stage 1022. When the amplifier 100 operates under the linear mode, the modulating circuit 1024 of the first operational signal path 102 is disable (or just disconnected from the output terminal of the common circuit stage 1022).

In addition, according to this embodiment, the amplifier 100 further may also comprise two multiplexers 108, 109, one switch 110, and one resistor 111. The first multiplexer 108 is coupled to the input terminal of the common circuit stage 1022, the output terminal of the output stage 106, and the first common feedback circuit 1026. When the amplifier 100 operates under the switch mode, the first multiplexer 108 is arranged to couple the input terminal of the common circuit stage 1022 to the first common feedback circuit 1026, and not couple the output terminal of the output stage 106 to the first common feedback circuit 1026 as shown in FIG. 2A. When the amplifier 100 operates under the linear mode, the first multiplexer 108 is arranged to couple the output terminal of the output stage 106 to the first common feedback circuit 1026, and not couple the input terminal of the common circuit stage 1022 to the first common feedback circuit 1026 as shown in FIG. 2B. Moreover, the second multiplexer 109 is coupled to the output terminal of the modulating circuit 1024, the output terminal of the middle circuit stage 1042, and the input terminal of the output stage 106. When the amplifier 100 operates under the switch mode, the second multiplexer 109 is arranged to couple the output terminal of the modulating circuit 1024 to the input terminal of the output stage 106, and not couple the output terminal of the middle circuit stage 1042 to the input terminal of the output stage 106 as shown in FIG. 2A. When the amplifier 100 operates under the linear mode, the second multiplexer 109 is arranged to couple the output terminal of the middle circuit stage 1042 to the input terminal of the output stage 106, and not couple the output terminal of the modulating circuit 1024 to the input terminal of the output stage 106 as shown in FIG. 2B.

In addition, the switch 110 is coupled between the output terminal of the common circuit stage 1022 and the input terminal of the middle circuit stage 1042. The switch 110 is arranged to disconnect the output terminal of the common circuit stage 1022 from the input terminal of the middle circuit stage 1042 during the switch mode, and connect the output terminal of the common circuit stage 1022 to the input terminal of the middle circuit stage 1042 during the linear mode. A terminal of the resistor 111 is coupled to the input signal Sin and the other terminal of the resistor 111 is coupled to the input terminal of the common circuit stage 1022. The resistor 111 is arranged to be a common input resistor of the amplifier 100 during the switch mode and the linear mode.

Furthermore, according to this embodiment, the common circuit stage 1022 may be a Class-AB differential low noise amplifier having a negative input terminal coupled to the input signal Sin, and a positive input terminal coupled to a common mode voltage Vcm. The modulating circuit 1024 may be a pulse-width modulation circuit but not limited thereto. The middle circuit stage 1042 may be a Class-AB amplifier. Moreover, the output stage 106 may be a CMOS (Complementary metal-oxide-semiconductor) driver comprising a high side PMOS transistor and a low side NMOS transistor as shown in FIG. 1, and the CMOS driver is coupled to a supply voltage (i.e. Vdd) of the amplifier 100 or directly powered by the voltage VBAT generated by the system battery, and this is not a limitation of this embodiment. In other words, both the high side transistor and the low side transistor of the output stage 106 may be NMOS transistors in one embodiment. The output stage 106 may also be a cascaded structure, in which both the high side stage and the low side stage comprise a plurality of PMOS and NMOS transistors. The first common feedback circuit 1026 may be a capacitor. The second common feedback circuit 1026 may be a resistor.

Accordingly, during the switch mode, the first common feedback circuit 1026 and the common circuit stage 1022 are arranged to be a Class-D integrator of a Class-D amplifier (note that for illustration purpose, only one integrator stage is shown in this embodiment, however, this is not meant to be a limitation). The first pre-output signal Sp1 generated by the modulating circuit 1024 is a modulated switching signal (such as a pulse-width modulated switching signal) arranged to switch the CMOS driver, i.e. the output stage 106, to generate a Class-D audio signal, i.e. the first output signal So1. During the linear mode, the first common feedback circuit 1026 is arranged to be a Miller compensation capacitor between the middle circuit stage 1042 and the output stage 106. Therefore, the common circuit stage 1022, the middle circuit stage 1042, and the output stage 106 are arranged to be three Class-AB stages to generate a Class-AB audio signal, i.e. the second output signal So2 (similarly, although this embodiment takes three Class-AB stages as an example, this is not meant to be a limitation).

According to the above description, there are at least five common circuit elements (i.e. the common circuit stage 1022, the output stage 106, the first common feedback circuit 1026, the second common feedback circuit 1028, and the input resistor 111) are shared during the switch mode and the linear mode of the amplifier 100. Therefore, the size occupied by the amplifier 100 is greatly reduced in compared with the conventional multi-purposes audio amplifier. However, in other embodiments, the first operational signal path 102 and the second operational signal path 104 may share only the common circuit stage 1022, the first common feedback circuit 1026, the second common feedback circuit 1028, or a combination thereof. In other words, there may be one common circuit stage 1022 shared by the switch mode and linear mode and two respective first common feedback circuits (and/or two respective second common feedback circuits, and/or two respective CMOS drivers) for each mode; or there may be one second common feedback circuit 1028 shared by the switch mode and linear mode and two respective common circuit stages and/or two respective first common feedback circuits for each mode (that is, separate Class-D integrator stage and Class-AB amplifier stage).

Figure 3:
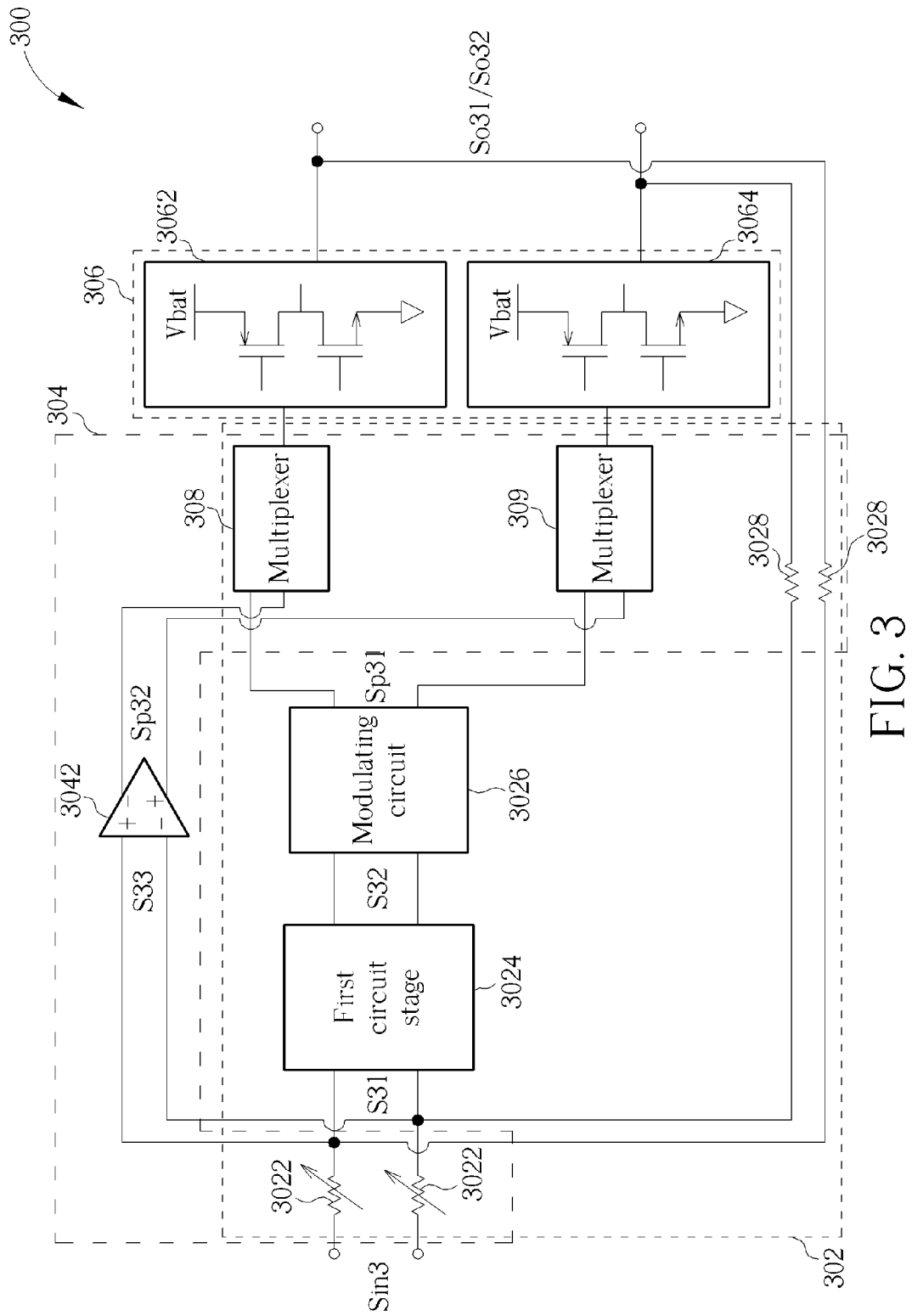
FIG. 3 is a diagram illustrating an amplifier according to a second embodiment of the present invention.

Please refer to FIG. 3, which is a diagram illustrating an amplifier 300 according to a second embodiment of the present invention. The amplifier 300 may be a multi-purpose audio amplifier of a portable communication device. Therefore, in this embodiment, the operation of the amplifier 300 may have two different operating modes, the first operating mode is a switch mode and the second operating mode is a linear mode. Furthermore, the amplifier 300 comprises a first operational signal path 302, a second operational signal path 304, and an output stage 306. The amplifier 300 is a differential amplifier, therefore the circuit blocks in the amplifier 300 are mostly designed to have differential configuration, and the signals of this embodiment described in the following paragraph are differential signals.

The first operational signal path 302 is arranged to generate a first pre-output signal Sp31 according to an input signal Sin3 under the switch mode of the amplifier 300. The second operational signal path 304 is arranged to generate a second pre-output signal Sp32 according to the input signal Sin3 under the linear mode of the amplifier 300. The output stage 306 is coupled to the first operational signal path 302 and the second operational signal path 304 for outputting a first output signal So31 according to the first pre-output signal Sp31 under the switch mode and outputting a second output signal So32 according to the second pre-output signal Sp32 under the linear mode.

When the amplifier 300 operates under the switch mode, the first operational signal path 302 comprises a first common impedance network 3022, a first circuit stage 3024, a modulating circuit 3026, and a second common impedance network 3028. The first common impedance network 3022 is arranged to receive the input signal Sin3 for generating a first signal S31. The first circuit stage 3024 is arranged to receive the first signal S31 for generating a second signal S32. The modulating circuit 3026 is arranged to perform a modulation upon the second signal S32 for generating the first pre-output signal Sp31. The second common impedance network 3028 is arranged to couple between an output port of the first common impedance network 3022 and an output port of the output stage 306. The output port of the first common impedance network 3022 is arranged to output the first signal S31, and the output port of the output stage 306 is arranged to output the first output signal So31.

On the other hand, when the amplifier 300 operates under the linear mode, the second operational signal path 304 comprises the first common impedance network 3022, a second circuit stage 3042, and the second common feedback circuit 3028. The first common impedance network 3022 is arranged to receive the input signal Sin3 for generating a third signal S33. The second circuit stage 3042 is arranged to receive the third signal S33 for generating the second pre-output signal Sp32. The second common impedance network 3028 is arranged to couple between the output port of the first impedance network 3022 and the output port of the output stage 306. The output port of the first impedance network 3022 is arranged to output the third signal S33, and the output port of the output stage 306 is arranged to output the second output signal So32.

According to the embodiment shown in FIG. 3, the common circuit elements when the amplifier 300 operates under the switch mode and the linear mode include the first common impedance network 3022, the output stage 306, and the second common impedance network 3028. When the amplifier 300 operates under the switch mode, the second circuit stage 3042 of the second operational signal path 304 is disconnected (or just disable) from the output port of the first common impedance network 3022. When the amplifier 300 operates under the linear mode, the first circuit stage 3024 and the modulating circuit 3026 of the first operational signal path 302 are disable (or just disconnected from the output port of the first common impedance network 3022).

In addition, according to this embodiment, the amplifier 300 further may also comprise two multiplexers 308 and 309. The output stage 306 comprises two CMOS drivers 3062 and 3064. The first multiplexer 308 is coupled to one output terminal of the modulating circuit 3026, one output terminal of the second circuit stage 3042, and the input terminal of the first CMOS driver 3062. The second multiplexer 309 is coupled to the other output terminal of the modulating circuit 3026, the other output terminal of the second circuit stage 3042, and the input terminal of the second CMOS driver 3064.

When the amplifier 300 operates under the switch mode, the multiplexers 308 and 309 are arranged to couple the output terminals of the modulating circuit 3026 to the input terminals of the CMOS drivers 3062 and 3064 respectively, and not couple the output terminals of the second circuit stage 3042 to the CMOS drivers 3062 and 3064. When the amplifier 300 operates under the linear mode, the multiplexers 308 and 309 are arranged to couple the output terminals of the second circuit stage 3042 to the input terminals of the CMOS drivers 3062 and 3064 respectively, and not couple the output terminals of the modulating circuit 3026 to the CMOS drivers 3062 and 3064.

Furthermore, according to this embodiment, the first circuit stage 3024 may be a Class-D feedback error correction loop. More particularly, the Class-D feedback error correction loop may comprise at least one above-mentioned integrator stage coupled in series. The modulating circuit 3026 may be a pulse-width modulation circuit but not limited thereto. The second circuit stage 3042 may be a linear amplifier front-end circuit stage or Class-AB amplifier. More particularly, the linear amplifier front-end circuit stage may comprises at least one above-mentioned Class-AB stage with Miller compensation capacitor network. Moreover, both the CMOS drivers 3062 and 3064 of the output stage 306 comprise a high side PMOS transistor and a low side NMOS transistor as shown in FIG. 3, and the CMOS driver is coupled to a supply voltage (i.e. Vdd) of the amplifier 100 or directly powered by the voltage VBAT generated by the system battery, and this is not a limitation of this embodiment. In other words, both the high side transistor and the low side transistor of the output stage 306 may be NMOS transistors in one embodiment. The output stage 306 may also be a cascaded structure, in which both the high side stage and the low side stage comprise a plurality of PMOS and NMOS transistors. The first common feedback circuit 3022 may comprise two adjustable resistors, and the second common feedback circuit 3028 may comprise two resistors as shown in FIG. 3.

Accordingly, during the switch mode, the first pre-output signal Sp31 generated by the modulating circuit 3026 is a modulated switching signal such as a pulse-width modulated switching signal arranged to switch the CMOS drivers, i.e. the output stage 306, to generate a Class-D audio signal, i.e. the first output signal So31. During the linear mode, the second circuit stage 3042 and the output stage 306 are arranged to be two Class-AB stages to generate a Class-AB audio signal, i.e. the second output signal So32.

According to the above description, there are at least three common circuit elements (i.e. the first common impedance network 3022, the output stage 306, and the second common impedance network 3028) are shared during the switch mode and the linear mode of the amplifier 300. Therefore, the size occupied by the amplifier 300 is greatly reduced in compared with the conventional multi-purposes audio amplifier. However, in other embodiments, the first operational signal path 302 and the second operational signal path 304 may share only the first common impedance network 3022, the output stage 306, the second common impedance network 3028, or a combination thereof. In other words, there may be one first common impedance network 3022 shared by the switch mode and linear mode and two respective second common impedance network (and/or two respective CMOS drivers) for each mode.

Figure 4:
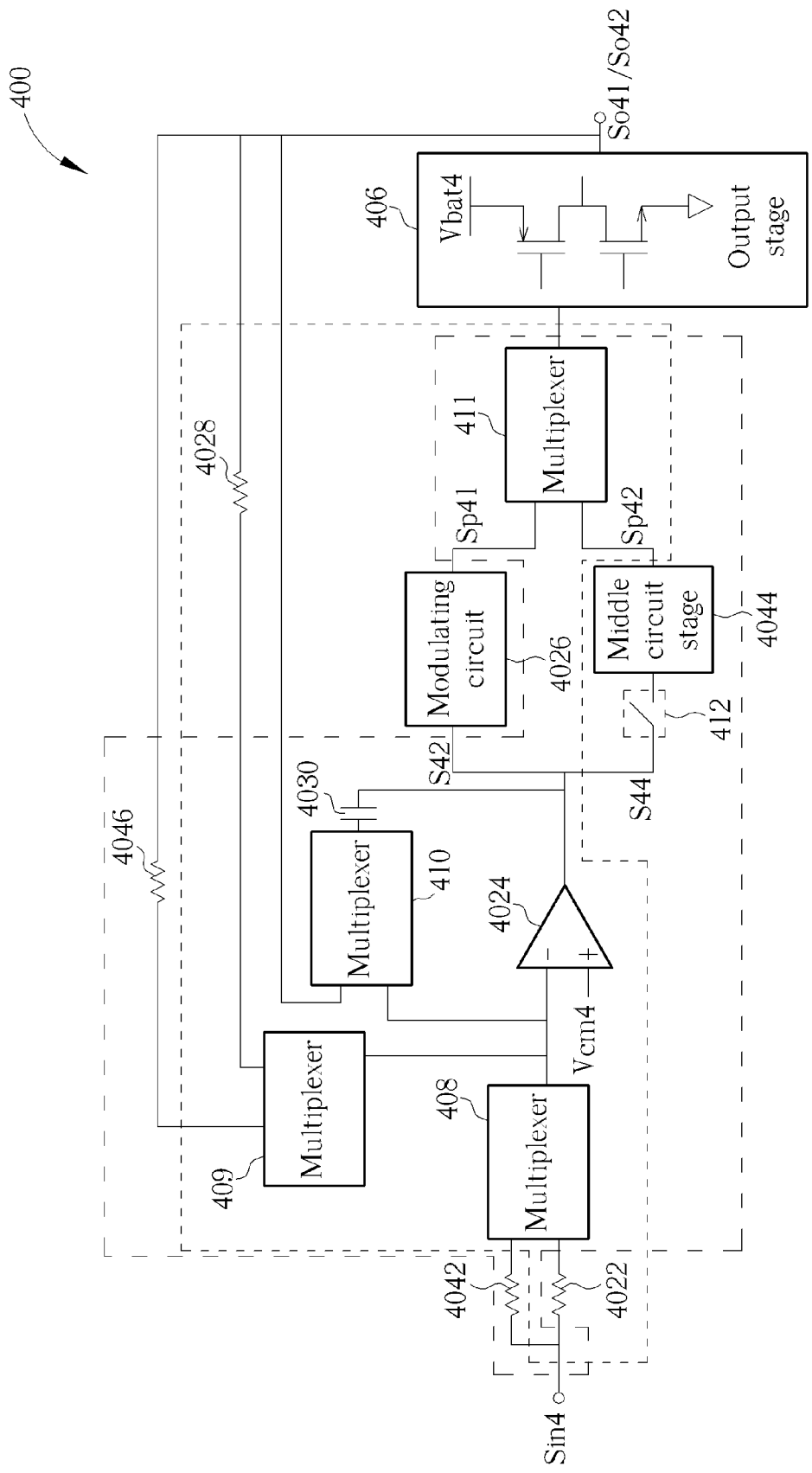
FIG. 4 is a diagram illustrating an amplifier according to a third embodiment of the present invention.

Please refer to FIG. 4, which is a diagram illustrating an amplifier 400 according to a third embodiment of the present invention. The amplifier 400 may be a multi-purpose audio amplifier of a portable communication device. Therefore, in this embodiment, the operation of the amplifier 400 may have two different operating modes, the first operating mode is a switch mode and the second operating mode is a linear mode. Furthermore, the amplifier 400 comprises a first operational signal path 402, a second operational signal path 404, and an output stage 406.

The first operational signal path 402 is arranged to generate a first pre-output signal Sp41 according to an input signal Sin4 under the switch mode of the amplifier 400. The second operational signal path 404 is arranged to generate a second pre-output signal Sp42 according to the input signal Sin4 under the linear mode of the amplifier 400. The output stage 406 is coupled to the first operational signal path 402 and the second operational signal path 404 for outputting a first output signal So41 according to the first pre-output signal Sp41 under the switch mode and outputting a second output signal So42 according to the second pre-output signal Sp42 under the linear mode.

Figure 5A:
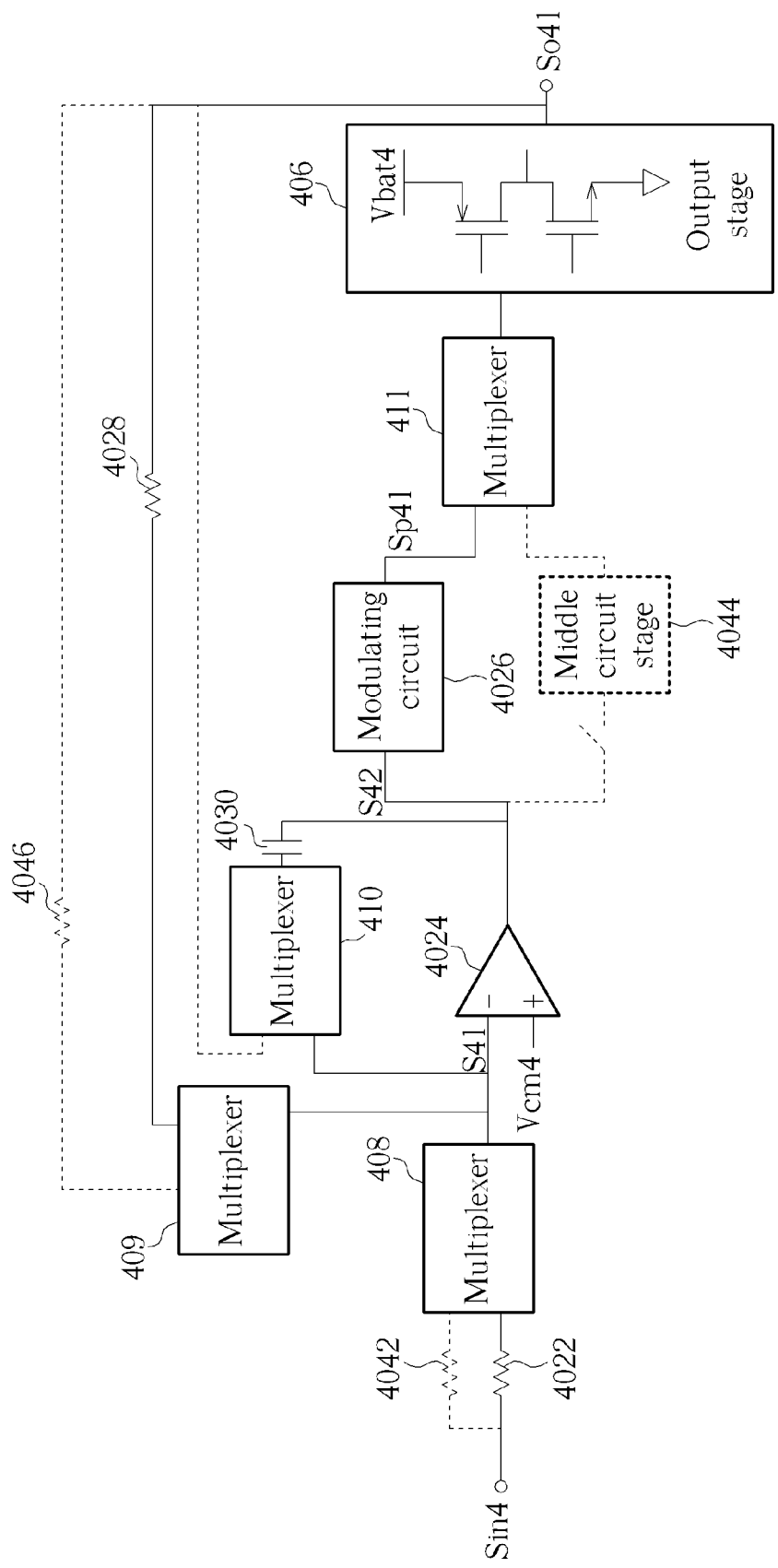
FIG. 5A is a diagram illustrating the amplifier in FIG. 4 operating under the switch mode according to an embodiment of the present invention.
Figure 5B:
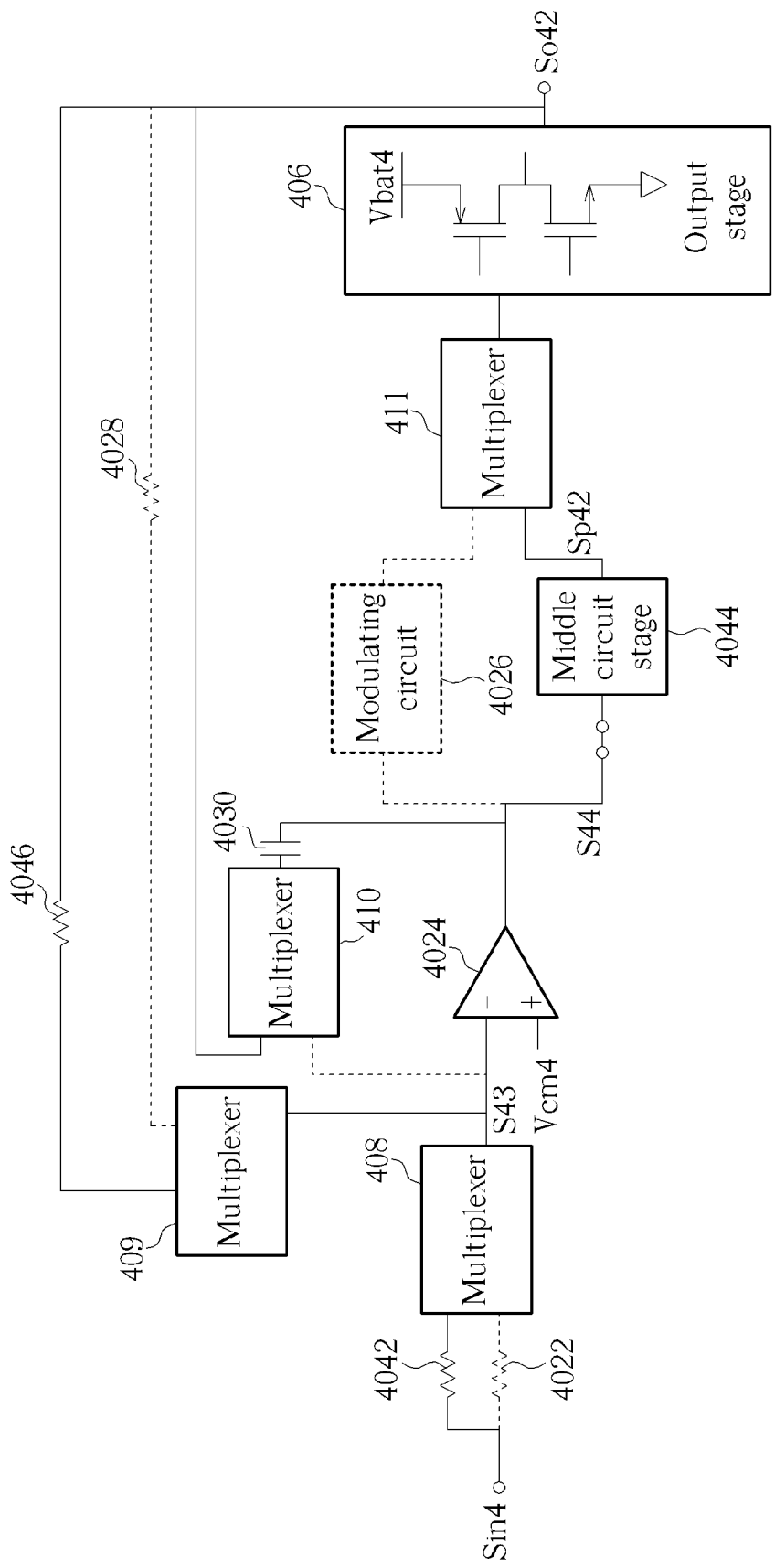
FIG. 5B is a diagram illustrating the amplifier in FIG. 4 operating under the linear mode according to an embodiment of the present invention.

Please refer to FIG. 5A and FIG. 5B. FIG. 5A is a diagram illustrating the amplifier 400 operating under the switch mode according to an embodiment of the present invention. FIG. 5B is a diagram illustrating the amplifier 400 operating under the linear mode according to an embodiment of the present invention. When the amplifier 400 operates under the switch mode, the first operational signal path 402 comprises a first impedance network 4022, a common circuit state 4024, a modulating circuit 4026, a second impedance network 4028, and a common feedback circuit 4030. The first impedance network 4022 is arranged to receive the input signal Sin4 for generating a first signal S41. The common circuit stage 4024 is arranged to receive the first signal S41 for generating a second signal S42. The modulating circuit 4026 is arranged to perform a modulation upon the second signal S42 for generating the first pre-output signal Sp41. The second impedance network 4028 is arranged to couple between an output terminal of the first impedance network 4022 and an output terminal of the output stage 406, wherein the output terminal of the first impedance network 4022 is arranged to output the first signal S41, and the output terminal of the output stage 406 is arranged to output the first output signal So41. The common feedback circuit 4030 is arranged to couple between an input terminal of the common circuit stage 4024 and an output terminal of the common circuit stage 4024, wherein the input terminal of the common circuit stage 4024 is arranged to receive the first signal S41, and the output terminal of the common circuit stage 4024 is arranged to output the second signal S42.

When the amplifier 400 operates under the linear mode, the second operational signal path 404 comprises a third impedance network 4042, the common circuit stage 4024, a middle circuit stage 4044, a fourth impedance network 4046, and the common feedback circuit 4030. The third impedance network 4042 is arranged to receive the input signal Sin4 for generating a third signal S43. The common circuit stage 4024 is arranged to receive the third signal S43 for generating a fourth signal S44. The middle circuit stage 4044 is arranged to receive the fourth signal S44 for generating the second pre-output signal Sp42. The fourth impedance network 4046 is arranged to couple between an output terminal of the third impedance network 4042 and the output terminal of the output stage 406, wherein the output terminal of the third impedance network 4042 is arranged to output the third signal S43, and the output terminal of the output stage 406 is arranged to output the second output signal So42. The common feedback circuit 4030 is arranged to couple between the output terminal of the common circuit stage 4024 and the output terminal of the output stage 406, wherein the output terminal of the common circuit stage 4024 is arranged to output the fourth signal S44, and the output terminal of the output stage 406 is arranged to output the second output signal So42.

According to FIG. 5A and FIG. 5B, the common circuit elements when the amplifier 100 operates under the switch mode and the linear mode comprise the common circuit state 4024, the common feedback circuit 4030, and the output stage 406. When the amplifier 400 operates under the switch mode, the middle circuit stage 4044 of the second operational signal path 404 is disconnected (or just disable) from the output terminal of the common circuit stage 4024. When the amplifier 400 operates under the linear mode, the modulating circuit 4026 of the first operational signal path 402 is disable (or just disconnected from the output terminal of the common circuit stage 4024).

In addition, according to this embodiment, the amplifier 400 further may also comprise four multiplexers 408, 409, 410, 411, and one switch 412. The first multiplexer 408 is coupled to the first impedance network 4022, the third impedance network 4042, and the input terminal of the common circuit stage 4024. When the amplifier 400 operates under the switch mode, the first multiplexer 408 is arranged to couple the first impedance network 4022 to the input terminal of the common circuit stage 4024, and not couple the third impedance network 4042 to the input terminal of the common circuit stage 4024 as shown in FIG. 5A. When the amplifier 400 operates under the linear mode, the first multiplexer 408 is arranged to couple the third impedance network 4042 to the input terminal of the common circuit stage 4024 and not couple the first impedance network 4022 to the input terminal of the common circuit stage 4024 as shown in FIG. 5B.

The second multiplexer 409 is coupled to the second impedance network 4028, the fourth impedance network 4046, and the input terminal of the common circuit stage 4024. When the amplifier 400 operates under the switch mode, the second multiplexer 409 is arranged to couple the second impedance network 4028 to the input terminal of the common circuit stage 4024, and not couple the fourth impedance network 4046 to the input terminal of the common circuit stage 4024 as shown in FIG. 5A. When the amplifier 400 operates under the linear mode, the second multiplexer 408 is arranged to couple the fourth impedance network 4046 to the input terminal of the common circuit stage 4024 and not couple the second impedance network 4028 to the input terminal of the common circuit stage 4024 as shown in FIG. 5B.

The third multiplexer 410 is coupled to the input terminal of the common circuit stage 4024, the output terminal of the output stage 406, and the common feedback circuit 4030. When the amplifier 400 operates under the switch mode, the third multiplexer 410 is arranged to couple the common feedback circuit 4030 between the input terminal of the common circuit stage 4024 and the output terminal of the common circuit stage 4024, and not couple the output terminal of the output stage 406 to the output terminal of the common circuit stage 4024 as shown in FIG. 5A. When the amplifier 400 operates under the linear mode, the third multiplexer 410 is arranged to couple the common feedback circuit 4030 between the output terminal of the output stage 406 and the output terminal of the common circuit stage 4024, and not couple the input terminal of the common circuit stage 4024 to the output terminal of the common circuit stage 4024 as shown in FIG. 5B.

The fourth multiplexer 411 is coupled to the output terminal of the modulating circuit 4026, the output terminal of the middle circuit stage 4044, and the input terminal of the output stage 406. When the amplifier 400 operates under the switch mode, the fourth multiplexer 411 is arranged to couple the output terminal of the modulating circuit 4026 to the input terminal of the output stage 406, and not couple the output terminal of the middle circuit stage 4044 to the input terminal of the output stage 406 as shown in FIG. 5A. When the amplifier 400 operates under the linear mode, the fourth multiplexer 411 is arranged to couple the output terminal of the middle circuit stage 4044 to the input terminal of the output stage 406, and not couple the output terminal of the modulating circuit 4026 to the input terminal of the output stage 406 as shown in FIG. 5B.

In addition, the switch 412 is coupled between the output terminal of the common circuit stage 4024 and the input terminal of the middle circuit stage 4044. The switch 412 is arranged to disconnect the output terminal of the common circuit stage 4024 from the input terminal of the middle circuit stage 4044 during the switch mode, and connect the output terminal of the common circuit stage 4024 to the input terminal of the middle circuit stage 4044 during the linear mode.

Furthermore, according to this embodiment, the common circuit stage 4024 may be a differential amplifier having a negative input terminal coupled to the input signal Sin4, and a positive input terminal coupled to a common mode voltage Vcm4. The modulating circuit 4026 may be a pulse-width modulation circuit. The middle circuit stage 4044 may be a linear amplifier following stage. Moreover, the output stage 406 may be a CMOS (Complementary metal-oxide-semiconductor) driver comprising a high side PMOS transistor and a low side NMOS transistor as shown in FIG. 4, and the CMOS driver is coupled to a supply voltage (i.e. Vdd) of the amplifier 100 or directly powered by the voltage VBAT4 generated by the system battery, and this is not a limitation of this embodiment. In other words, both the high side transistor and the low side transistor of the output stage 406 may be NMOS transistors in one embodiment. The output stage 406 may also be a cascaded structure, in which both the high side stage and the low side stage comprise a plurality of PMOS and NMOS transistors. The common feedback circuit 4030 may be a capacitor.

Accordingly, during the switch mode, the common feedback circuit 4030 and the common circuit stage 4024 are arranged to be a Class-D integrator. The first pre-output signal Sp41 generated by the modulating circuit 4026 is a modulated switching signal such as a pulse-width modulated signal arranged to switch the CMOS driver, i.e. the output stage 406, to generate a Class-D audio signal, i.e. the first output signal So41. During the linear mode, the common feedback circuit 4030 is arranged to be a Miller compensation capacitor between the middle circuit stage 4044 and the output stage 406. Therefore, the common circuit stage 4024, the middle circuit stage 4044, and the output stage 406 are arranged to be three linear amplifier stages to generate a Class-AB audio signal, i.e. the second output signal So42. Similarly, although this embodiment takes one integrator stage and three Class-AB stages as an example, this is not meant to be a limitation.

According to the above description, there are at least three common circuit elements (i.e. the common circuit stage 4024, the output stage 406, and the common feedback circuit 4030) are shared during the switch mode and the linear mode of the amplifier 400. Therefore, the size occupied by the amplifier 400 is greatly reduced in compared with the conventional multi-purposes audio amplifier. However, in other embodiments, the first operational signal path 402 and the second operational signal path 404 may share only the common circuit stage 4024, the output stage 406, the common feedback circuit 4030, or a combination thereof. In other words, there may be one common circuit stage 4024 shared by the switch mode and linear mode and two respective common feedback circuit (and/or two respective CMOS drivers) for each mode.

Figure 6:
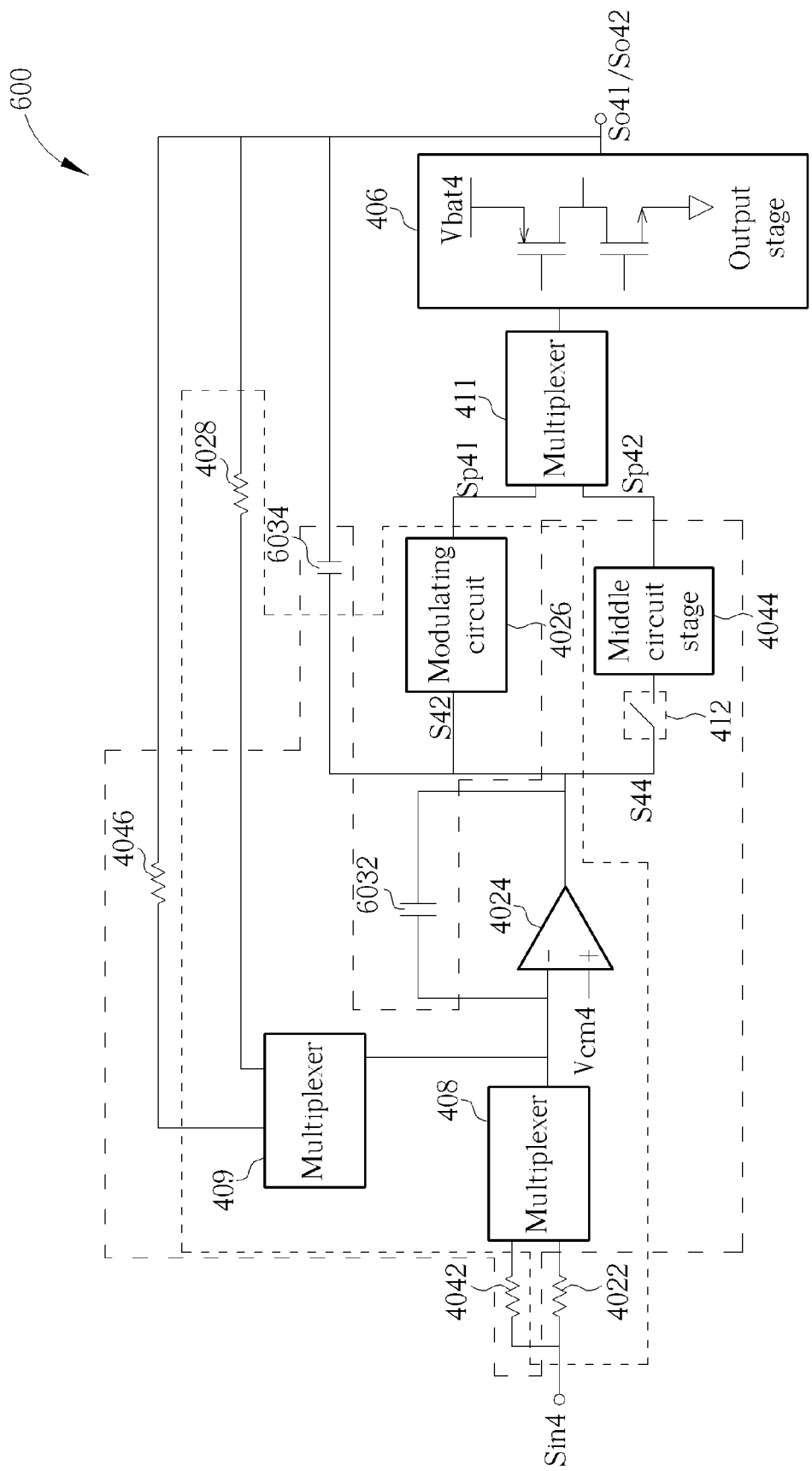
FIG. 6 is a diagram illustrating an amplifier according to a fourth embodiment of the present invention.

According to the embodiment shown in FIG. 4, when the amplifier 400 operates under the switch mode and the linear mode, the common feedback circuit 4030 is arranged to be a co-used capacitor in the amplifier 400, which means that the common feedback circuit 4030 is used as a feedback capacitor for the common circuit stage 4024 during the switch mode, and used as a feedback capacitor for the middle circuit stage 4044 and the output stage 406 during the linear mode. However, this is not a limitation of the present invention. Please refer to FIG. 6, which is a diagram illustrating an amplifier 600 according to a fourth embodiment of the present invention. It is noted that the circuit elements in the amplifier 600 are mainly similar to the circuit elements in the amplifier 500 except for the feedback circuit for the common circuit stage 4024 during the switch mode and the feedback circuit for the middle circuit stage 4044 and the output stage 406 during the linear mode. Therefore, the numerals labeled to the circuit elements in the amplifier 600 are the same as the numerals of the similar circuit elements in the amplifier 400 in FIG. 4 except that the feedback circuit for the common circuit stage 4024 during the switch mode is labeled as 6032, and the feedback circuit for the middle circuit stage 4044 and the output stage 406 during the linear mode is labeled as 6034.

Figure 7A:
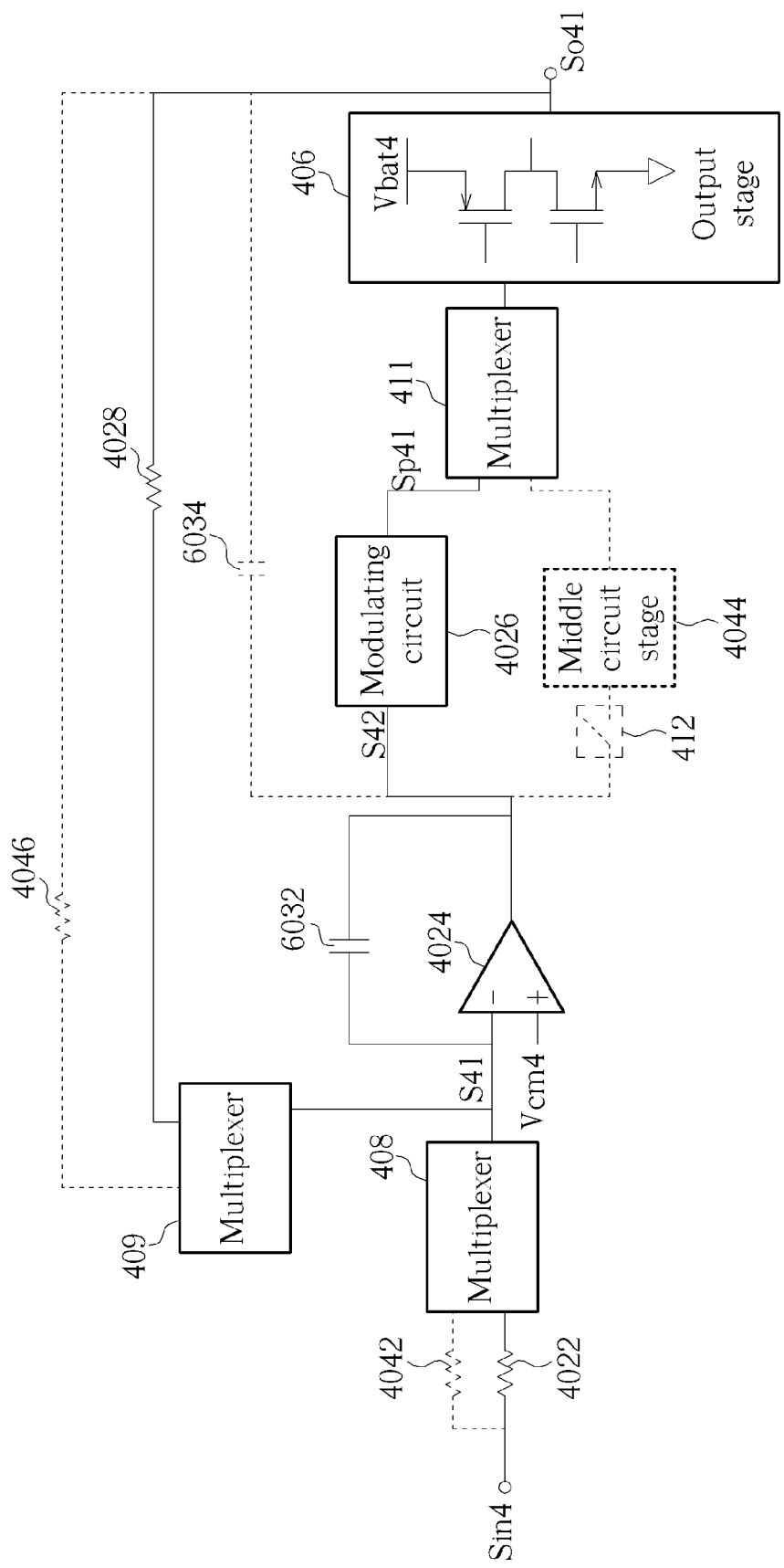
FIG. 7A is a diagram illustrating the amplifier in FIG. 6 operating under the switch mode according to an embodiment of the present invention.
Figure 7B:
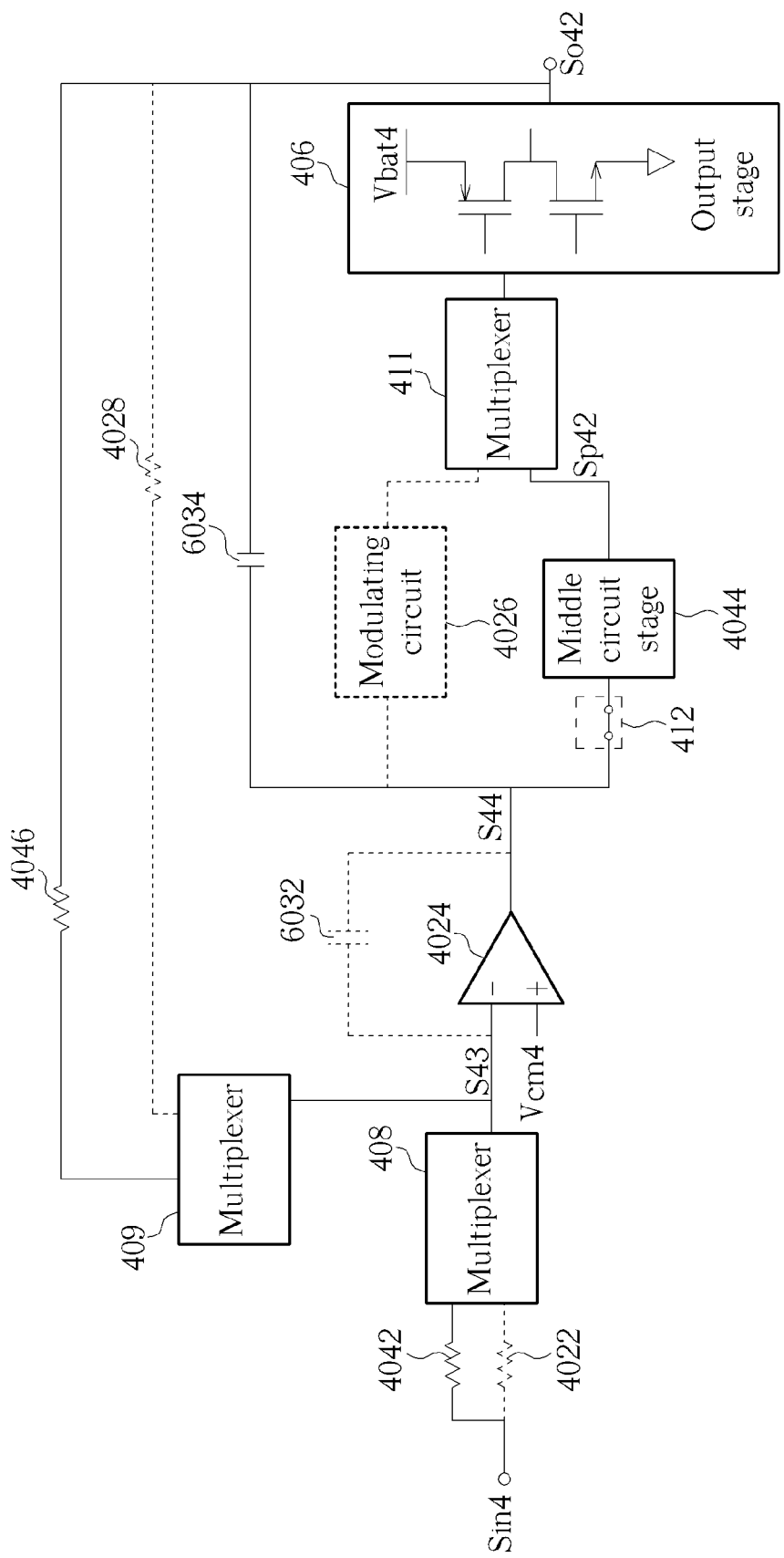
FIG. 7B is a diagram illustrating the amplifier in FIG. 6 operating under the linear mode according to an embodiment of the present invention.

Please refer to FIG. 7A and FIG. 7B. FIG. 7A is a diagram illustrating the amplifier 600 operating under the switch mode according to an embodiment of the present invention. FIG. 7B is a diagram illustrating the amplifier 600 operating under the linear mode according to an embodiment of the present invention. When the amplifier 600 operates under the switch mode, the feedback circuit 6032 is arranged to couple between the input terminal of the common circuit stage 4024 and the output terminal of the common circuit stage 4024, and the feedback circuit 6034 is arranged to not couple between the input terminal of the middle circuit stage 4044 and the output terminal of the output stage 406.

When the amplifier 600 operates under the linear mode, the feedback circuit 6032 is arranged to not couple between the input terminal of the common circuit stage 4024 and the output terminal of the common circuit stage 4024, and the feedback circuit 6034 is arranged to couple between the input terminal of the middle circuit stage 4044 and the output terminal of the output stage 406.

It is noted that the feedback circuit 6032 and the feedback circuit 6034 are two separated capacitors in the amplifier 600. Therefore, in this embodiment, there are at least two common circuit elements (i.e. the common circuit stage 4024 and the output stage 406) are shared during the switch mode and the linear mode of the amplifier 600. Therefore, the size occupied by the amplifier 600 is greatly reduced in compared with the conventional multi-purposes audio amplifier. It is also should be noted that those skilled in the art is appreciated to understand the operation of the amplifier 600 after reading the description of the amplifier 400 in the above paragraphs, thus the detailed description of the amplifier 600 is omitted here for brevity.

Figure 8A:
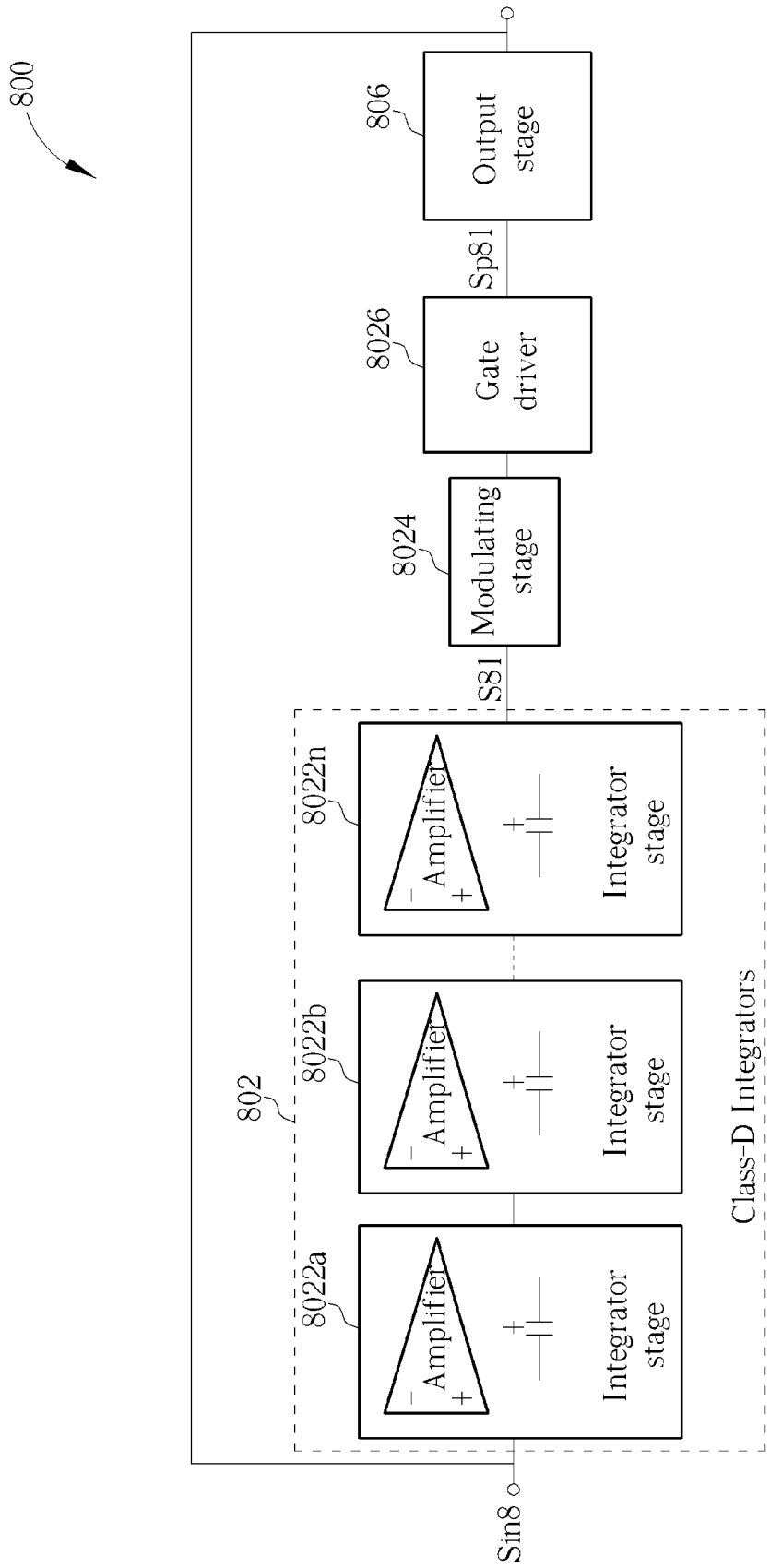
FIG. 8A is a diagram illustrating an amplifier operating under the switch mode according to a fifth embodiment of the present invention.
Figure 8B:
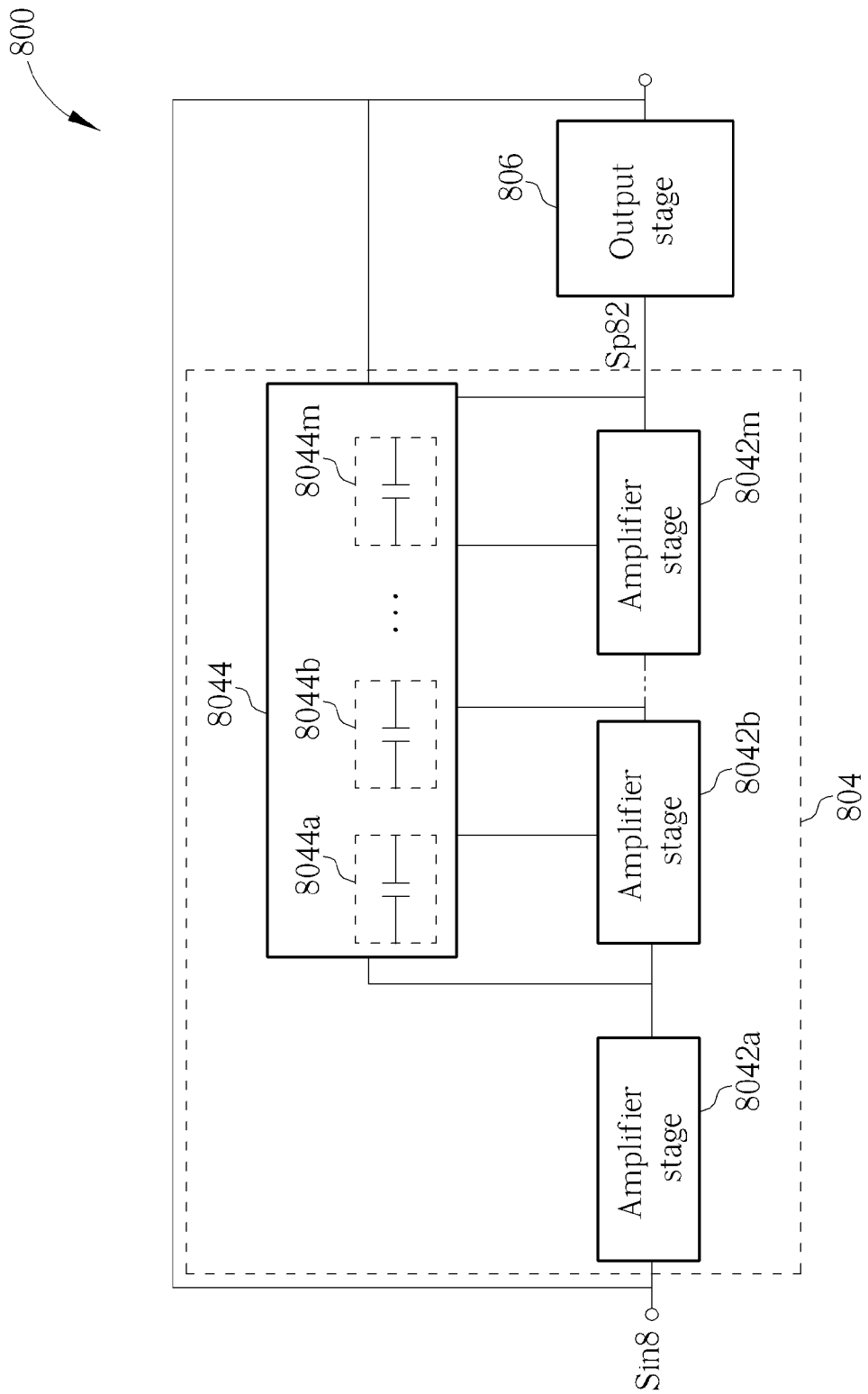
FIG. 8B is a diagram illustrating the amplifier operating under the linear mode according to the fifth embodiment of the present invention.

According to the above embodiments, it can be obtained that an integrator normally comprises an amplifier and a capacitor. Therefore, by appropriately arranging the connection between an amplifier and a capacitor, the amplifier and the capacitor can be designed to be an integrator of the audio amplifier during the switch mode, then the amplifier can also be arranged to be an amplifier stage and the capacitor can also be arranged to be a compensation network of the audio amplifier during the linear mode as shown in FIG. 8A and FIG. 8B respectively. FIG. 8A is a diagram illustrating an amplifier 800 operating under the switch mode according to a fifth embodiment of the present invention. FIG. 8B is a diagram illustrating the amplifier 800 operating under the linear mode according to the fifth embodiment of the present invention. Similar to the above embodiments, the amplifier 800 comprises a first operational signal path 802, a second operational signal path 804, and an output stage 806. When the amplifier 800 operates under the switch mode, the first operational signal path 802 of the amplifier comprises a plurality of cascaded integrator stages 8022a-8022n (also call Class-D integrators), a modulating circuit 8024, and a gate driver 8026. The plurality of cascaded integrator stages 8022a-8022n are arranged to receive the input signal Sin8 for generating a first signal S81. The modulating circuit 8024 in conjunction with the gate driver 8026 are arranged to perform a modulation upon the first signal S81 for generating the first pre-output signal Sp81. When the amplifier 800 operates under the linear mode, the second operational signal path 804 of the amplifier 800 comprises a plurality of cascaded amplifier stages 8042a-8042m and a plurality of feedback circuits 8044a-8044m (also labeled as 8044). The plurality of cascaded amplifier stages 8042a-8042m are arranged to receive the input signal Sin8 for generating the second pre-output signal Sp82. The plurality of feedback circuits 8044a-8044m are arranged to couple between an output terminal of the output stage 806 and a plurality of output terminals of the plurality of cascaded amplifier stages 8042a-8042m respectively. According to the embodiment of the present invention, each integrator stage of the cascaded integrator stages 8022a-8022n comprises an amplifier and a capacitor during the switch mode, and the amplifier of the integrator stage can also be arranged to be one amplifier stage of the cascaded amplifier stages 8042a-8042m and the capacitor of the integrator stage can also be arranged to be one feedback circuit of the plurality of feedback circuits 8042a-8042m. Therefore, the amplifier and the capacitor in one or more integrator stage are the shared components during the switch mode and the linear mode of the amplifier 800. It should be noted that the integrator stage may also comprise other necessary circuit elements installed therein, such as resistors, switches, etc. Thus, showing one amplifier and one capacitor in each integrator stage of the cascaded integrator stages 8022a-8022n is just for the sake of brevity, and is not a limitation of the embodiment. Similarly, the feedback circuits 8044 may also comprise other necessary circuit elements installed therein, such as resistors, switches, active amplifiers, and/or transconductance (i.e. gm) stages, etc. Thus, showing a plurality of capacitors (i.e. 8044a-8044m) in the feedback circuits 8044 is just for the sake of brevity, and is not a limitation of the embodiment.

Furthermore, it should be noted that the number of integrator stages in the first operational signal path 802 is not necessary to be equal to the number of amplifier stage in the second operational signal path 804, i.e. m≠n. Therefore, according to the present invention, at least one cascaded integrator stage of the plurality of cascaded integrator stages 8022*a*-8022*n* comprises an amplifier stage of the plurality of cascaded amplifier stages 8042*a*-8042*m* and a feedback circuit of the plurality of feedback circuits 8044*a*-8044*m*. It should be noted that the amplifier 800 in FIG. 8A and FIG. 8B is the general concept of the above mentioned embodiments, e.g., the amplifier 100, those skilled in the art are appreciated to understand the operation of the amplifier 800 after reading the operations of the above mentioned embodiments, thus the detailed description is omitted here for brevity.

Briefly, according to the above embodiments, by sharing the circuit elements in the amplifier to operate under the switch mode and the linear mode, the size occupied by the present amplifiers are greatly reduced in compared with the conventional multi-purposes audio amplifier.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier, comprising:
   a first operational signal path, arranged to generate a first pre-output signal according to an input signal under a first operating mode of the amplifier;
   a second operational signal path, arranged to generate a second pre-output signal according to the input signal under a second operating mode of the amplifier; and
   an output stage, coupled to the first operational signal path and the second operational signal path, for outputting a first output signal according to the first pre-output signal under the first operating mode and outputting a second output signal according to the second pre-output signal under the second operating mode;
   wherein the first operational signal path and the second operational signal path are arranged to share at least one common circuit element for generating the first pre-output signal and the second pre-output signal under the first operating mode and the second operating mode, respectively; and when the amplifier operates under the first operating mode, the first operational signal path comprises:
      a common circuit stage comprising an operational amplifier, arranged to use the operational amplifier to amplify the input signal for generating a first signal; and
      a modulating circuit, arranged to perform a modulation upon the first signal for generating the first pre-output signal; and
   when the amplifier operates under the second operating mode, the second operational signal path comprises:
      the common circuit stage comprising the operational amplifier, arranged to use the operational amplifier to amplify the input signal for generating a second signal; and
      a middle circuit stage, arranged to receive the second signal for generating the second pre-output signal.

2. The amplifier of claim 1, wherein when the amplifier operates under the first operating mode, the first operational signal path further comprises:
   a common feedback circuit, arranged to couple between an input terminal of the common circuit stage and an output terminal of the common circuit stage, wherein the input terminal of the common circuit stage is arranged to receive the input signal, and the output terminal of the common circuit stage is arranged to output the first signal; and
   when the amplifier operates under the second operating mode, the second operational signal path further comprises:
      the common feedback circuit, arranged to couple between the output terminal of the common circuit stage and an output terminal of the output stage, wherein the output terminal of the common circuit stage is arranged to generate the second signal, and the output terminal of the output stage is arranged to output the second output signal.

3. The amplifier of claim 1, wherein when the amplifier operates under the first operating mode, the first operational signal path further comprises:
   a common feedback circuit, arranged to couple between an input terminal of the common circuit stage and an output terminal of the output stage, wherein the input terminal of the common circuit stage is arranged to receive the input signal, and the output terminal of the output stage is arranged to output the first output signal; and
   when the amplifier operates under the second operating mode, the second operational signal path further comprises:
      the common feedback circuit, arranged to couple between the input terminal of the common circuit stage and the output terminal of the output stage, wherein the input terminal of the common circuit stage is arranged to receive the input signal, and the output terminal of the output stage is arranged to output the second output signal.

4. The amplifier of claim 1, wherein the first operating mode is a switch mode of the amplifier, and the second operating mode is a linear mode of the amplifier; and the first output signal under the switch mode has larger power and smaller linearity than the first output signal under the linear mode.

5. The amplifier of claim 1, wherein the first operating mode is a class-D mode of the amplifier, and the second operating mode is a class-AB mode of the amplifier.

6. An amplifier, comprising:
   a first operational signal path, arranged to generate a first pre-output signal according to an input signal under a first operating mode of the amplifier;
   a second operational signal path, arranged to generate a second pre-output signal according to the input signal under a second operating mode of the amplifier; and
   an output stage, coupled to the first operational signal path and the second operational signal path, for outputting a first output signal according to the first pre-output signal under the first operating mode and outputting a second output signal according to the second pre-output signal under the second operating mode;
   wherein the first operational signal path and the second operational signal path are arranged to share at least one common circuit element for generating the first pre-output signal and the second pre-output signal under the first operating mode and the second operating mode, respectively; and when the amplifier operates under the first operating mode, the first operational signal path comprises:
      a common feedback circuit comprising a capacitor, arranged to couple between an input terminal of a low noise amplifier and an output terminal of the low noise amplifier, wherein the input terminal of the low noise amplifier is arranged to receive the input signal, and the output terminal of the low noise amplifier is arranged to couple to the output stage, and the capacitor and the low noise amplifier are arranged to be an integrator for accumulating the input signal into the output terminal; and
   when the amplifier operates under the second operating mode, the second operational signal path comprises:

the common feedback circuit comprising the capacitor, arranged to couple between an output terminal of a low noise amplifier and an output terminal of the output stage, wherein the output terminal of the low noise amplifier is arranged to couple to the output stage, and the output terminal of the output stage is arranged to output the second output signal, and the capacitor is arranged to be a Miller compensation capacitor between a middle circuit stage and the output stage, wherein the middle circuit stage receives an output of the output terminal of a low noise amplifier to generating the second pre-output signal.

7. An amplifier, comprising:
a first operational signal path, arranged to generate a first pre-output signal according to an input signal under a first operating mode of the amplifier;
a second operational signal path, arranged to generate a second pre-output signal according to the input signal under a second operating mode of the amplifier; and
an output stage, coupled to the first operational signal path and the second operational signal path, for outputting a first output signal according to the first pre-output signal under the first operating mode and outputting a second output signal according to the second pre-output signal under the second operating mode;
wherein the first operational signal path and the second operational signal path are arranged to share at least one common circuit element for generating the first pre-output signal and the second pre-output signal under the first operating mode and the second operating mode, respectively; and when the amplifier operates under the first operating mode, the first operational signal path comprises:
  a common feedback circuit comprising an impedance element, arranged to directly connected between an input terminal of a low noise amplifier and an output terminal of the output stage, and to provide an impedance on a feedback path for directly coupling the first output signal to the input terminal of the low noise amplifier, wherein the input terminal of the low noise amplifier is arranged to receive the input signal, and the output terminal of the output stage is arranged to output the first output signal; and
when the amplifier operates under the second operating mode, the second operational signal path comprises:
  the common feedback circuit comprising the impedance element, arranged to directly connected between an input terminal of a low noise amplifier and the output terminal of the output stage, and to provide the impedance on the feedback path for directly coupling the second output signal to the input terminal of the low noise amplifier, wherein the input terminal of the low noise amplifier is arranged to receive the input signal, and the output terminal of the output stage is arranged to output the second output signal.

8. An amplifier, comprising:
a first operational signal path, arranged to generate a first pre-output signal according to an input signal under a first operating mode of the amplifier;
a second operational signal path, arranged to generate a second pre-output signal according to the input signal under a second operating mode of the amplifier; and
an output stage, coupled to the first operational signal path and the second operational signal path, for outputting a first output signal according to the first pre-output signal under the first operating mode and outputting a second output signal according to the second pre-output signal under the second operating mode;
wherein the first operational signal path and the second operational signal path are arranged to share at least one common circuit element for generating the first pre-output signal and the second pre-output signal under the first operating mode and the second operating mode, respectively; and when the amplifier operates under the first operating mode, the first operational signal path comprises:
  a first common impedance network, arranged to receive the input signal for generating a first signal;
  a first circuit stage, arranged to receive the first signal for generating a second signal;
  a modulating circuit, arranged to perform a modulation upon the second signal for generating the first pre-output signal; and
  a second common impedance network, arranged to directly connected between an output port of the first common impedance network and an output port of the output stage, and to provide an impedance on a feedback path for directly coupling the first output signal to the output port of the first common impedance network, wherein the output port of the first common impedance network is arranged to output the first signal, and the output port of the output stage is arranged to output the first output signal; and
when the amplifier operates under the second operating mode, the second operational signal path comprises:
  the first common impedance network, arranged to receive the input signal for generating a third signal;
  a second circuit stage, arranged to receive the third signal for generating the second pre-output signal; and
  the second common impedance network, arranged to directly connected between the output port of the first impedance network and the output port of the output stage, and to provide the impedance on the feedback path for directly coupling the second output signal to the output port of the first common impedance network, wherein the output port of the output stage is arranged to output the second output signal.

9. An amplifier, comprising:
a first operational signal path, arranged to generate a first pre-output signal according to an input signal under a first operating mode of the amplifier;
a second operational signal path, arranged to generate a second pre-output signal according to the input signal under a second operating mode of the amplifier; and
an output stage, coupled to the first operational signal path and the second operational signal path, for outputting a first output signal according to the first pre-output signal under the first operating mode and outputting a second output signal according to the second pre-output signal under the second operating mode;
wherein the first operational signal path and the second operational signal path are arranged to share at least one common circuit element for generating the first pre-output signal and the second pre-output signal under the first operating mode and the second operating mode, respectively; and when the amplifier operates under the first operating mode, the first operational signal path comprises:
  a first impedance network, arranged to receive the input signal for generating a first signal;
  a common circuit stage comprising an operational amplifier, arranged to use the operational amplifier to amplify the first signal for generating a second signal;

a modulating circuit, arranged to perform a modulation upon the second signal for generating the first pre-output signal; and a second impedance network, arranged to couple between an output terminal of the first impedance network and an output terminal of the output stage, wherein the output terminal of the output stage is arranged to output the first output signal;

when the amplifier operates under the second operating mode, the second operational signal path comprises:

a third impedance network, arranged to receive the input signal for generating a third signal;

the common circuit stage comprising the operational amplifier, arranged to use the operational amplifier to amplify the third signal for generating a fourth signal;

a middle circuit stage, arranged to receive the fourth signal for generating the second pre-output signal; and a fourth impedance network, arranged to couple between an output terminal of the third impedance network and the output terminal of the output stage, wherein the output terminal of the output stage is arranged to output the second output signal.

10. The amplifier of claim 9, wherein when the amplifier operates under the first operating mode, the first operational signal path further comprises:

a common feedback circuit, arranged to couple between an input terminal of the common circuit stage and an output terminal of the common circuit stage, wherein the input terminal of the common circuit stage is arranged to receive the first signal, and the output terminal of the common circuit stage is arranged to output the second signal; and when the amplifier operates under the second operating mode, the second operational signal path further comprises:

the common feedback circuit, arranged to couple between the output terminal of the common circuit stage and the output terminal of the output stage, wherein the output terminal of the common circuit stage is arranged to output the fourth signal, and the output terminal of the output stage is arranged to output the second output signal.

11. The amplifier of claim 9, wherein when the amplifier operates under the first operating mode, the first operational signal path further comprises:

a first feedback circuit, arranged to couple between an input terminal of the common circuit stage and an output terminal of the common circuit stage, wherein the input terminal of the common circuit stage is arranged to receive the first signal, and the output terminal of the common circuit stage is arranged to output the second signal; and when the amplifier operates under the second operating mode, the second operational signal path further comprises:

a second feedback circuit, arranged to couple between the output terminal of the common circuit stage and the output terminal of the output stage, wherein the output terminal of the common circuit stage is arranged to output the fourth signal, and the output terminal of the output stage is arranged to output the second output signal.

12. An amplifier, comprising:

a first operational signal path, arranged to generate a first pre-output signal according to an input signal under a first operating mode of the amplifier;

a second operational signal path, arranged to generate a second pre-output signal according to the input signal under a second operating mode of the amplifier; and an output stage, coupled to the first operational signal path and the second operational signal path, for outputting a first output signal according to the first pre-output signal under the first operating mode and outputting a second output signal according to the second pre-output signal under the second operating mode;

wherein the first operational signal path and the second operational signal path are arranged to share at least one common circuit element for generating the first pre-output signal and the second pre-output signal under the first operating mode and the second operating mode, respectively; and when the amplifier operates under the first operating mode, the first operational signal path comprises:

a plurality of cascaded integrator stages, arranged to receive the input signal for generating a first signal; and a modulating circuit, arranged to perform a modulation upon the first signal for generating the first pre-output signal; and when the amplifier operates under the second operating mode, the second operational signal path comprises:

a plurality of cascaded amplifier stages, arranged to receive the input signal for generating the second pre-output signal; and a plurality of feedback circuits, arranged to couple between an output terminal of the output stage and a plurality of output terminals of the plurality of feedback circuits respectively;

wherein when the amplifier operates under the first operating mode, at least one cascaded integrator stage of the plurality of cascaded integrator stages comprises an amplifier stage of the plurality of cascaded amplifier stages and a feedback circuit of the plurality of feedback circuits.

* * * * *